United States Patent [19]

Bates et al.

[11] 4,267,010
[45] May 12, 1981

[54] GUIDANCE MECHANISM

[75] Inventors: Herbert E. Bates, Sudbury; Stanley W. Strzepek, Hudson, both of Mass.

[73] Assignee: Mobil Tyco Solar Energy Corporation, Waltham, Mass.

[21] Appl. No.: 159,837

[22] Filed: Jun. 16, 1980

[51] Int. Cl.³ ............................................. C30B 15/24
[52] U.S. Cl. ..................................... 156/608; 422/249
[58] Field of Search ....... 156/608, DIG. 88, DIG. 73, 156/DIG. 98; 422/249; 164/60

[56] References Cited

U.S. PATENT DOCUMENTS

| | | | |
|---|---|---|---|
| 3,119,778 | 1/1964 | Hamiton | 156/608 |
| 3,471,266 | 10/1969 | Belle | 156/608 |
| 3,591,348 | 7/1971 | Belle | 156/608 |
| 3,650,703 | 3/1972 | Labelle et al. | 156/DIG. 88 |
| 3,857,679 | 12/1974 | Allred | 422/249 |
| 4,118,197 | 10/1978 | Mackintosh | 156/DIG. 98 |
| 4,158,038 | 6/1979 | Jewett | 422/249 |

Primary Examiner—Hiram Bernstein
Attorney, Agent, or Firm—Schiller & Pandiscio

[57] ABSTRACT

An improved method of growing ribbon-shaped crystalline bodies is disclosed. The method comprises the step of pulling the body from a melt pool through a very narrow gap as the body cools through a range of temperatures at which significant plastic deformation can occur so as to reduce the amount of buckling the body otherwise experienced due to transverse residual stress. The method in its preferred form utilizes an improved guidance mechanism for use with apparatus for growing ribbon-shaped bodies. The mechanism comprises a pair of heat-conductive plates rigidly positioned with respect to the melt pool. The plates are disposed in opposing relation so that their opposing surfaces define the gap therebetween and so that the plates are positioned (1) respectively on opposite sides of and close to the side surfaces of the body as the body is being pulled from the melt pool through the gap; and (2) in a region between the melt pool and the body pulling mechanism where the body cools through the range of temperatures at which significant plastic deformation occurs. The plates defining the gap are spaced apart by an amount (1) greater than the expected thickness of the ribbon-shaped bodies being grown, and (2) sufficiently small so that when flatness variations produced in the ribbon shaped body as it is pulled from the melt pool exceed a predetermined maximum as determined by the spacing provided by the gap, the ribbon will interact with the plates and the flatness variations will be reduced so as not to exceed the predetermined maximum.

14 Claims, 6 Drawing Figures

GUIDANCE MECHANISM

This invention relates to the growth of crystalline bodies from a melt and more particularly to an improved apparatus for and method of growing substantially flat ribbon-shaped crystalline bodies having controlled maximum flatness variations.

Various processes of growing substantially flat ribbon-shaped crystals from a melt material such as silicon are now known. The capillary die process of growing ribbon-shaped crystalline bodies generally utilizes a capillary die or forming member from which the body can be grown. This latter process can be carried out in accordance with various techniques including the one described in U.S. Pat. No. 3,591,348 (issued to LaBelle on July 6, 1971) wherein the bodies are described as being grown in accordance with the edge-defined filmfed growth technique (also known as the EFG Process), and U.S. Pat. No. 3,471,266 (issued to LaBelle on Oct. 7, 1969), wherein the bodies are grown in accordance with the self filling tube process (the SFT Process). Other techniques include laser recrystallization, the Inverted Stepanov or "ribbon-to-ribbon" technique. A major problem associated with all of these techniques, particularly when growing ribbon-shaped silicon is that transverse residual stresses can be created in the ribbon-shaped body during growth, which in turn can cause stress-induced flatness variations (or waves in the ribbon-shaped body) termed "buckles" or "ripples". The term "flatness variation" as used hereinafter shall, for convenience, be defined as the amount that either of the opposite side surfaces of a ribbon-shaped body or any part of these side surfaces is laterally displaced from its normal plane. Flatness variations can be caused by thermal effects, such as those encountered by cooling the ribbon-shaped bodies along a relatively uncontrolled temperature gradient. In addition, flatness variations can be caused by mechanical effects such as that typically encountered when the uncontrolled temperature gradient induced buckles mechanically interact with various parts of the growth apparatus intended for guidance and pulling of the ribbon. The sum of these thermal and mechanical effects have resulted in silicon ribbon which is so unflat as to make the fabrication of solar blanks impossible over significant areas. For example, typically only 5-30% of two inch wide, twelve to fifteen mil thick silicone ribbon grown through an uncontrolled thermal gradient at at pulling rate of approximately 0.75 inches/minute can pass through a 36 mil wide gap. With the ribbon of an average thickness of approximately twelve to fifteen mils, the curvature produced by these flatness variations can be so great as to produce a lateral displacement of each of the side surfaces of the ribbon from its normal plane equal to 20 mils or greater.

Common types of damage resulting from this transverse residual stress and resulting buckling are spontaneous shattering of ribbons during growth or handling or fracture to an excessive extent during scribing of the ribbon-shaped bodies in connection with cutting them into blanks.

Consideration of various types of post-solidification temperature fields experienced by a growing ribbon had led to the identification of various types of buckles, viz., pure edge, pure center and mixed edge and center.

Attempts to remove the stresses by annealing have not been found to be satisfactory, at least in the case of silicon ribbon. Experience with silicon ribbon growth using the capillary die processes described in U.S. Pat. Nos. 3,591,348 and 3,471,366 has indicated the stress problem worsens with increases in growth rate, i.e., pulling speed and ribbon widths.

In U.S. Pat. No. 4,158,038 (issued to Jewett on June 12, 1979) the patentee discloses that the temperature field experienced by the ribbon can be suitably adjusted to yield substantially stress-free and flat ribbon-shaped crystalline bodies. The patentee describes an afterheating system for providing heat and in particular a controlled temperature gradient along the pulling axis of the body. The afterheating system establishes and maintains a substantially linear temperature gradient in the crystalline body as the latter is cooled from a temperature close to the melting point of the material to below the range of significant plastic flow. The afterheating system comprises two heat conductive graphite plates having opposing parallel surfaces which define a passageway through which the silicon body is pulled. The gap between each side surface of the hot ribbon-shaped crystal pulled through the passageway and the adjacent portions of the graphite plates is described as small, preferably less than about 30 mils. A gap of approximately the same size is kept between the side edges of the ribbon-shaped crystal and the plates. Where the system of the Jewett patent is used for growing silicon ribbon, since silicon ribbon of one inch width and wider is now being grown with an average center thickness of 12 to 15 mils, the total gap of the passageway between the two graphite plates is therefore in the range of 75 mils. In fact with the Jewett system silicon ribbon has been grown in afterheater passageways as small as 60 mils. In such a system the gap between the ribbon and each plate is sized to accommodate a gaseous heat conducting medium for better heat transfer between the crystal and the adjacent portions of the plates, the gas seeming to supplement radiative heat transfer with conductive heat flow.

The upstream or lower end of the passageway adjacent the melt pool from which the body is pulled is deliberately connected to a source of heat while the down stream or upper end is connected to a heat sink. By providing sufficient heat to the lower end of the passageway and making the passageway long enough, the desired linear or near-linear temperature gradient can be achieved. For silicon, having a melting point of about 1415° C., the desired temperature gradient provided by the afterheating system is described at its lower or upstream end to be between about 1050° C. and 1250° C. and its downstream end to be about 600° C. or less.

While it can be seen in principle that the temperature field experienced by the ribbon can be suitably adjusted to yield flat, stress-free ribbon, the practical application of this solution using the afterheating system of the Jewett patent is difficult. First, the exact temperature at the lower end of the passageway must be carefully controlled to insure the desired temperature gradient. Secondly, and more importantly although the gap between the plates which forms the passageway is small, i.e., a minimum of 60 mils, it nevertheless must be large enough to permit the gas medium between the side surfaces of the body being pulled through the passageway and the opposing surfaces of the graphite plates to serve as an effective heat conductive medium therebetween so as to establish the desired temperature gradient. As a consequence, ribbon of an average thickness of 12 to 15 mils in the center can still exhibit maximum flatness variations of 20 mils or greater due to the gap of the passageway which is much larger than the maximum acceptable flatness variations of the ribbon.

It is therefore an object of the present invention to provide an improved apparatus for and method of further reducing transverse residual stress in crystalline bodies as they are grown.

Another object of the present invention is to minimize the amount a crystalline body deviates from its pulling axis as the body is pulled from a pool of melt.

And another object of the present invention is to provide an improved apparatus for and method of setting the maximum acceptable flatness variations of ribbon-shaped crystalline bodies grown in accordance with a capillary die process of the type described in U.S. Pat. Nos. 3,591,348 or 3,471,266.

Still another object of the present invention is to provide improved apparatus for and method of constraining thermal deformation of a ribbon-shaped crystal while it cools through a range of temperatures at which significant plastic deformation may occur.

Yet another object of the present invention is to provide an improved method of and guidance mechanism for aiding the alignment of a crystal seed with the slot in a capillary die top, and for guiding the ribbon-shaped crystalline bodies as they are being grown from the die top.

And still another object of the present invention is to provide an improved method of and guidance mechanism for use in capillary die processes which mechanism provides greater growth stability and reduced susceptibility of the growth interface between the growing solid body and the liquid melt pool on the die top to mechanical perturbations of the ribbon body by other parts of the growing apparatus.

These and other objects of the present invention are provided by an improved method of and apparatus for growing crystalline bodies of a selected material. In accordance with the present invention the body is pulled from a pool of melt of said material through a passageway positioned in the region where the body cools through a range of temperatures at which significant plastic deformation of the material can occur. The passageway has a minimum spacing (1) greater than the maximum expected thickness of the body, and (2) sufficiently small so that the ribbon interacts with the walls of the passageway such that those flatness variations produced in the ribbon-shaped body as it is pulled from the melt pool which exceed a predetermined maximum amount as determined by the minimum spacing provided by the passageway are reduced so as not to exceed the predetermined maximum. The minimum spacing of the passageway is substantially smaller than that provided in the afterheating system of the Jewett patent. The preferred apparatus for use in growing ribbon-shaped bodies comprises a pair of heat-conductive plates having portions respectively positioned on opposite sides of the body so as to define a passageway having a narrower gap through which the center portion of the ribbon-shaped body is pulled.

Other features and many attendant advantages of this invention are described or rendered obvious by the following detailed specification which is to be considered together with the accompanying drawings wherein.

Figure 1:
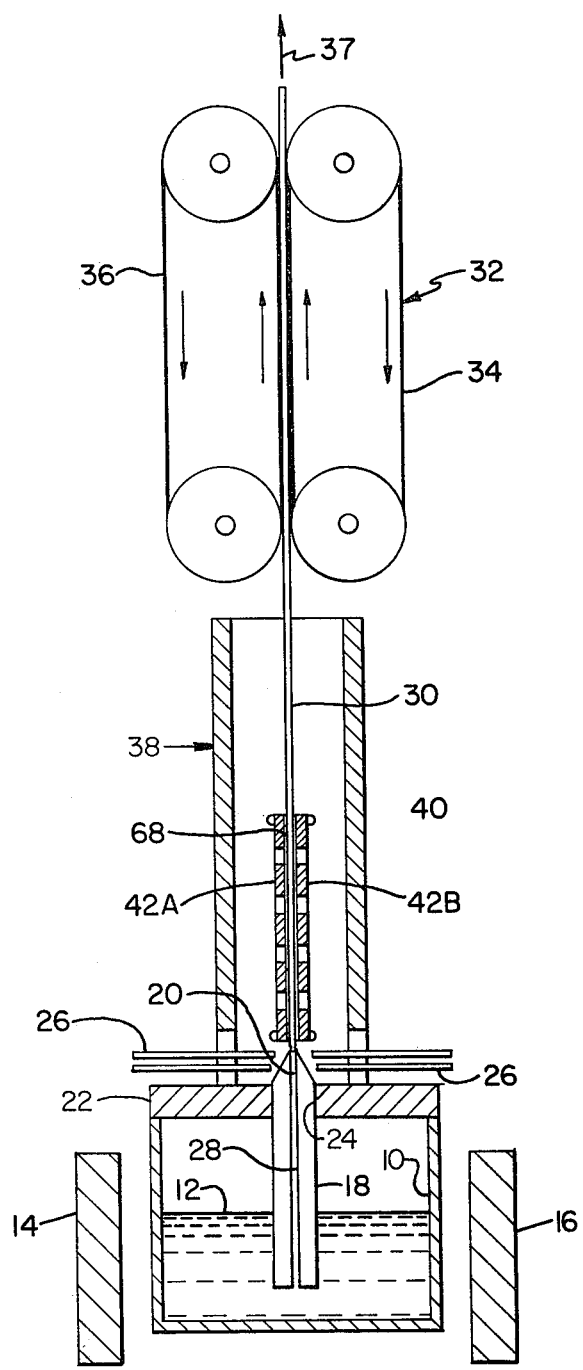
FIG. 1 is a schematic view of the preferred embodiment of the apparatus of the present invention positioned with respect to crystal growing apparatus so as to illustrate the arrangement and function of the present invention.
Figure 3:
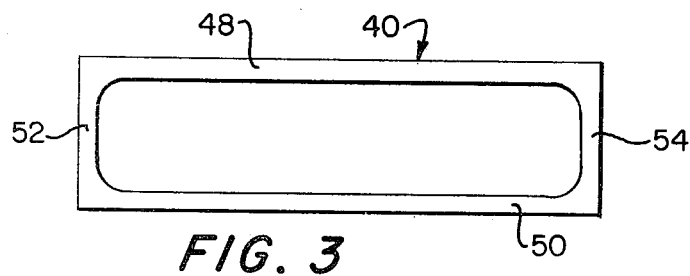
FIG. 3 is a top view of the support of FIG. 2.
Figure 2:
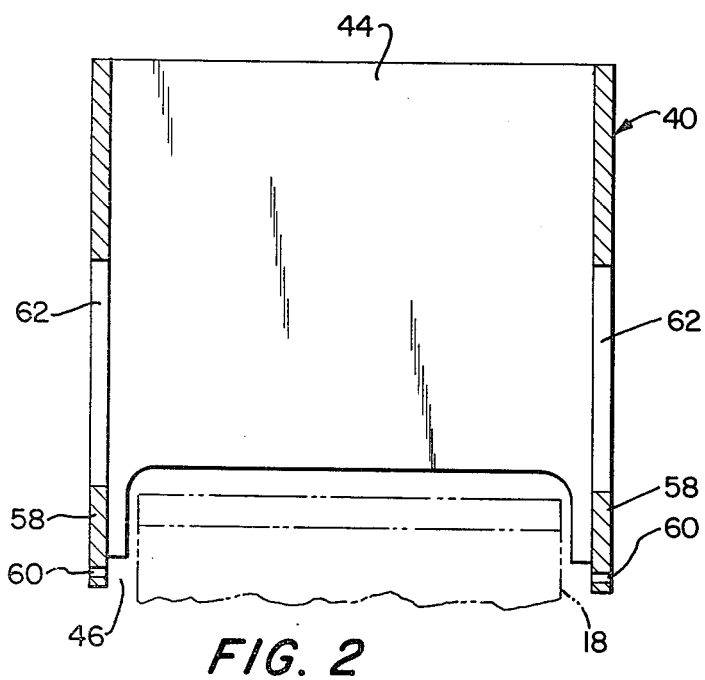
FIG. 2 is a cross-sectional view, in elevation, of the support of the preferred embodiment of the FIG. 1 guidance mechanism.
Figure 4:
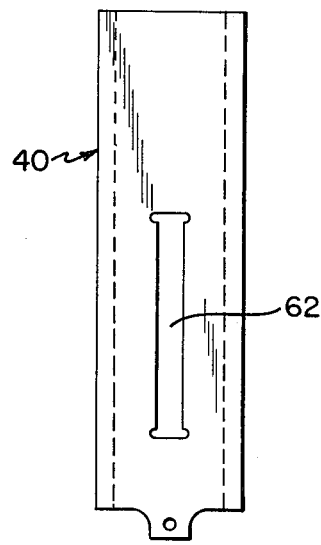
FIG. 4 is a side view of the support of FIG. 2.
Figure 5:
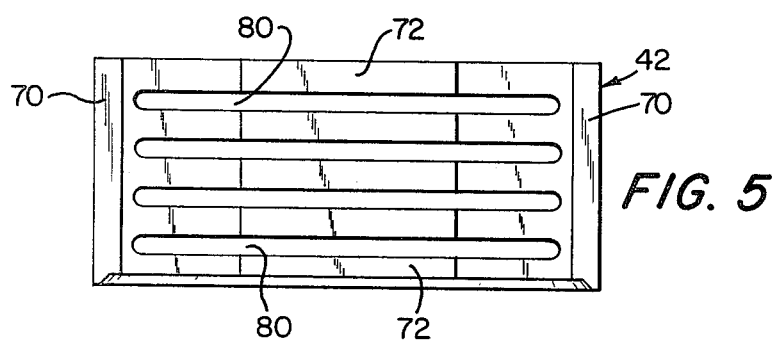
FIG. 5 is a side view of one plate of the preferred embodiment of the FIG. 1 guidance mechanism.

Although the specific form of the invention hereinafter described is directed to growth of silicon ribbon, it is to be understood that the invention may be adapted for use in growing crystalline bodies of other materials and/or other cross-sectional shapes.

As described in the Jewett Patent, transverse residual stress is a stress system satisfying internal equilibrium with no external loads or temperature gradients. It is accompanied by an elastic strain distribution in the crystalline material.

The present invention is concerned with the matter of transverse residual stress in the growth of ribbon-shaped crystals, and the effect of this stress on the plastic strain induced deformation and imperfections in grown crystals. Transverse residual stresses can generally be relieved by small amounts of relaxation of plastic strain. If residual stresses are present, they can cause or promote, inter alia, buckling, as well as fracture, plastic flow and creep. By way of example, the transverse residual stresses in silicon ribbon may be as high as 30,000 psi (the fracture stress of silicon at room temperature is approximately 80,000 psi). Residual stresses in a grown crystal result from the plastic deformation which the crystal undergoes at high temperatures.

It therefore is desirable to minimize the extent of plastic deformation and, therefore the strain-induced imperfections. It is also desirable to reduce to a tolerable level the transverse residual plastic stress in the crystal when it reaches room temperature.

One possible solution to the residual stress problem is described in the Jewett Patent. Even though the afterheating system described reduces transverse residual stresses in the growing crystalline bodies, there will still be some flatness variations in the growing body due to the relatively large gap provided by the heated passageway through which the body passes. Further, the growth interface between the growing solid body and the liquid melt pool on the die top is still susceptible to mechanical perturbations of the ribbon body by other parts of the growing apparatus such as the mechanism used to pull the body.

It is the approach of the present invention to pass the ribbon grown from a pool of melt while it is cooling through the temperature range where significant plastic deformation occurs through a very narrow gap. The gap is sized (1) larger than the expected cross-sectional thickness of the ribbon, and (2) sufficiently narrow so that the opposing walls defining the gap reduce those flatness variations produced in the ribbon as it is pulled from the melt pool which exceed a predetermined maximum as determined by the spacing provided by the gap. Although it is not clear how a reduction in flatness variations of the ribbon-shaped body occurs, it is believed that the ribbon actually interacts with the opposing walls defining the gap when the flatness variations exceed the tolerance set by the gap so as to iron or flatten the ribbon while it is still in its plastic state. For silicon ribbons having center thicknesses in the range of 12 to 15 mils a gap which has been found to be satisfactory at least where the center portion of the ribbon passes, is about 20 mils so as to provide a minimum space between each of the surfaces of the crystal ribbon and the opposing wall of the passageway in the range of between about 2.5 and 4 mils.

FIG. 1 illustrates application of the present invention to a system for continuously growing silicon ribbon. The crucible 10 contains a supply of silicon 12. The crucible is disposed in a furnace enclosure (not shown) which contains heating means represented schematically at 14 and 16 which are used to maintain the supply of silicon in the molten state. A graphite die plate 22 supported by and covering the crucible includes an aperture 24 for supporting a graphite capillary die 18 shaped for growing flat ribbons. The lower end of the capillary die is submerged into silicon melt 12 while the upper end extends through and is suitably supported in the aperture 24 of the die plate 22. Although it is not shown in detail, it is to be understood that at its upper end the breadth of the die (i.e., the dimension of the die 18 which is perpendicular to the plane of the drawing in FIG. 1) is substantially greater than its width (i.e., the left-to-right dimension of the die in FIG. 1), so that the edge configuration of its upper end is rectangular as required for growing a thin ribbon. The upper end of the die is beveled on its opposite broad sides, while a slot 20, coplanar with the pulling plane (which contains the pulling axis) extends the width of the die 18. Face and edge heaters (not shown) can be disposed close to the upper end of the die 18. The upper end of the die is surrounded by one or more radiation shields as shown at 26 which serve to limit radiative heat loss from the upper end of the die. In normal operations, a ribbon-shaped crystalline body 30 is continuously grown from a growth pool of melt at the upper end of the die and the melt consumed in formation of the crystalline body is replaced by upward flow of melt in the capillary 28 of the die through the slot 20 to the top end of the die.

The ribbon 30 is continuously pulled by means of a suitable pulling mechanism 32 which preferably, but not necessarily, is of the type comprising a pair of endless belts 34 and 36 arranged to grip the opposite broad sides of the crystal 30. One form of a suitable endless belt pulling mechanism is disclosed in U.S. Pat. No. 3,607,112 issued Sept. 21, 1971 to Seymour Mermelstein. Such a puller is adapted to pull a ribbon or other form of crystalline body at a precisely controlled speed along a pulling axis 37. Pulling the ribbon-like body through an uncontrolled temperature field results in transverse residual stress which in turn results in the center plane of the body (equally spaced from and disposed between the side surfaces of the ribbon-shaped body) deviating from the pulling plane (defined by the plane which includes the slot 20 and pulling axis 37).

The guidance mechanism 38, made in accordance with the principles of the present invention, is designed to limit the amount of variation of the center plane of ribbon 30 from its pulling plane, and its pulling axis. Mechanism 38 is positioned between the top of die 18 and pulling mechanism 32 in a region where the ribbon 30 cools through a range of temperatures at which significant plastic deformation occurs. For silicon the range of temperatures at which significant plastic deformation can occur are temperatures greater than 800° C. up to the melting point of 1415° C. The plates are positioned as close to the top of the die as is practical, for example, one-quarter inch above the die, since the temperature of the melt pool is at the melting point. The preferred guidance mechanism 38 comprises a heat-conductive support 40 for rigidly positioning heat-conductive plates 42A and 42B respectively on opposite sides of and close to the side surfaces of the cooling crystal 30 as the crystal is pulled by pulling mechanism 32. Depending upon the product being grown, guidance mechanism 38 may be made of any suitable heat-conductive material. In the case of silicon ribbons, the parts of mechanism 38 are all made of high purity graphite.

Figure 6:
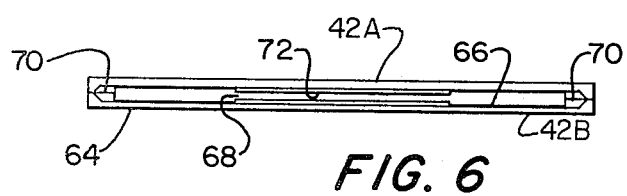
FIG. 6 is a top view of two plates like the one in FIG. 5.

Support 40 is affixed to die plate 22 so that it cannot move relative to die 18. Support 40 is generally a hollow structure, open at its upper and lower ends 44 and 46, respectively, and has opposite side surfaces 48 and 50 and opposite edge surfaces 52 and 54 to define generally a rectangular cross-sectional shape. The lower end of each side surface 48 and 50 is provided with extending tabs 58. Each tab 58 is provided with a hole 60 for receiving an attaching pin (not shown) which serves to rigidly mount support 40 to die plate 22. The edge surfaces 52 and 54 are also provided with oppositely disposed longitudinal slots 62 for tightly receiving the two plates 42A and 42B and holding them together as shown in FIGS. 1 and 6.

Each plate 42A and 42B is provided with a flat outer surface 64 while its inside surface 66 is contoured such that when both plates are positioned with their inside surfaces opposing one another in slots 62 of support 40, a passageway 68 (shown in FIGS. 1 and 6) in the form of a rectangular slot is provided therebetween, extending above the die 18 coplanar with the slot 20 of the die 18 and thus the pulling plane of the crystal. In particular the contour of the inside surface 66 of each plate 42 is preferably shaped so that the opposite ends 70 of each plate contact the corresponding ends of the other plate with the passageway 68 extending therebetween. The length of the entire passageway 68 thus formed is slightly larger than the length of the slot 20 of the die 18 so that the entire ribbon-shaped body 30 can be pulled through the passageway. The center portion of each plate is preferably provided with a flat land or raised section 72 which is identical to and opposes the raised section of the opposite plate so that the center portion of the passageway 68 is narrower than its end portions (i.e. the portions between the ends 70 and the raised sections 72). The narrower center portion of passageway 68 provides the minimum gap of the passageway and is provided for several reasons. First, ribbon-shaped bodies 30 (at least those made from silicon material) tend to be thinner in the center than at the edges. For example, one inch and wider silicon ribbons grown by the EFG Process have a center thickness of about twelve to fifteen mils as intended, while the edges of the same ribbons are typically about twenty mils or thicker. Further, when growing silicon ribbon for use in making solar cell blanks, the flatness of the center portion of the ribbon tends to be more critical than the edges. Additionally, substantially reducing the variations in flatness of the center portion of the ribbon crystals results in reasonably small variations at the edges. Accordingly, the gap provided between the opposing raised sections 72 of the plates 42 is, in the preferred embodiment, more critical than the gap provided at each edge of the passageway 68. Dimensions which have been found to provide good results in growing ribbon-shaped crystalline bodies made of silicon material of one inch width or wider are a twenty mil gap between opposing sections 72 of plates 42, and a sixty mil gap at the opposite edges of the passageway. This provides a range of 2.5 to 4 mils for the spacing between each center portion of the side surfaces of a growing ribbon 30 and the raised section 72 of the opposing plate 42 and will thus limit the flatness variation of each of the side surfaces of the ribbon to 2.5 to 4 mils.

Plates 42 are further provided with elongated holes 80 extending horizontally, parallel to one another so as to provide cooling vents for the ribbon 30 as the ribbon is pulled through the passageway 68. Preferably, holes 80 of one plate directly oppose the corresponding holes of the other plate.

The support 40 and plates 42 are preferably made for use in RF type furnaces, although they can be used equally as well in other types of furnaces, such as resistance heated furnaces.

Following is an example of growing silicon according to the present invention using apparatus as shown in the drawing.

EXAMPLE

An EFG capillary die is dimensioned so that at its upper end its outer edge configuration defines a rectangle measuring about 20 mils by 3 inches. The guidance mechanism 38 is dimensioned so that each graphite plate 42A and 42B is 3.35 inches wide, 1.50 inches high, and 90 mils thick at each end 70. Four holes 80, each 0.20 inches apart are provided in each plate 42A and 42B. The holes are dimensioned 2.875 inches long and typically 0.125 inches wide. The gap between the mutually confronting raised sections 72 of plates 42A and 42B is 20 mils while the gap between plates 42A and 42B in the regions between sections 72 and ends 70 is 60 mils. The plates 42 are about ¼ inch above the die top. The crucible 10 is filled with a melt of P-type silicon (doped with boron so as to have about 1 ohm-cm resistivity) and the die 18 is disposed as shown in FIG. 1 so that the lower end of the die is submerged in the melt. The molten feed material rises in capillary 28 to the top of the die. Heat is supplied to the system by energizing the heaters 14 and 16 and any face and edge heater provided as previously described, so that the temperature of the upper end of the die is about 10°–30° C. above the melting point of silicon and (2) the plates 42A and 42B are positioned in the temperature range where the growing ribbon 30 will still be in its plastic state. The furnace is filled with argon gas as is a well known practice. Thereafter, a seed crystal is lowered by the pulling mechanism 32 through passageway 68 so as to make contact with the top of the die 18. The lower end of the seed crystal melts and connects with the molten material at the upper end of the capillary 28 so as to form a growth pool of melt. Thereafter, the crystal pulling mechanism 32 is operated so as to cause the seed crystal to be pulled upwardly at a selected rate in the range of 0.6 to 1.0 inch/minute. As the seed crystal is pulled upwardly, a three inch wide silicon ribbon 30 measuring about 15 mils thickness at its center is continuously formed on the seed. The inner surfaces of plates 42A and 42B guide the growing ribbon while it is still in its plastic state and reduce the flatness variations of the center of the side surfaces of the ribbon to between about 2.5 and 4 mils. Accordingly, a substantially flat ribbon 30 results as it is pulled through passageway 68 with the ribbon having a flatness deviation along its length not exceeding about 4 mils at its center. The ribbon cools as it passes between plates 42. The ribbon is cooled to room temperature after it passes out of the furnace enclosure.

The guidance mechanism 38 thus provides an improved crystal 30 by appreciably reducing the flatness variations of the final crystal when compared with those grown with apparatus of the type described in the Jewett Patent. The lower edges of the plates 42 are placed relatively close to the top of die 18 so as to come as closely as possible to the range of temperatures where substantial plastic deformation can occur, and to provide a good guide for aligning the seed crystal with the slot 20 at the top of die 18 when commencing growth of the crystal 30. It will be appreciated that the maximum acceptable flatness variation of ribbon body grown is thus determined by (and in fact is equal to) the tolerances provided between each of the surfaces of the passageway and the respective opposing side surfaces of the growing crystalline ribbon-shaped body. This is different from the afterheating system of the Jewett patent which describes controlling flatness variations by providing a controlled temperature gradient.

Since certain changes may be made in the above apparatus and process without departing from the scope of the invention therein involved, it is intended that all matter contained in the above description or shown in the accompanying drawing shall be interpreted in an illustrative and not in a limiting sense.

What is claimed is:

1. For use with apparatus for growing a substantially flat crystalline body of a selected material from a melt of the same material, said apparatus being of the type comprising means for establishing a melt pool of said material and pulling means for pulling a substantially flat crystalline body progressively from said pool along a predetermined axis, an improved guidance mechanism comprising:

a pair of heat-conductive plates for guiding said body as said body is pulled from said pool; and means for holding said plates stationary relative to said melt pool substantially opposite and parallel to one another so that they are disposed (1) respectively on opposite sides of and close to said body when said body is pulled by said pulling means from said pool, and (2) in a region between said pool and said pulling means where said body cools through a range of temperatures at which significant plastic deformation of said body occurs;

said plates having confronting mutually spaced surfaces forming a passageway therebetween, the passageway having a minimum size measured from one to the other of said surfaces which size is (1) greater than the maximum expected thickness of said body passing therebetween and (2) sufficiently small so that when flatness variations produced in said body as it is pulled from said melt pool exceed a predetermined maximum dimension as determined by said minimum size the body interacts with said plates so as to reduce those flatness variations in the body so as not to exceed said predetermined maximum dimension.

2. A guidance mechanism according to claim 1, wherein said plates are contoured so that said minimum size is provided in that portion of said passageway through which the center portion of said body passes as said body is pulled by said pulling mechanism.

3. A guidance mechanism according to claim 1, wherein the opposing surfaces of said plates are formed such that the opposite ends of the plate contact the corresponding opposite ends of the other plate, and each of said plate is formed with a raised land portion between said opposite ends, and said minimum size is the spacing between the raised land portions of said plates.

4. A guidance mechanism according to claim 3, wherein said minimum size provides a gap between each of said raised land portions and the adjacent surface of the body as said body is pulled through said passageway of between about 2.5 to 4 mils.

5. A guidance mechanism according to claim 3, wherein said minimum size is approximately 20 mils, said mechanism being further characterized by a gap between said plates beyond the ends of said raised land portions of approximately 60 mils.

6. A guidance mechanism according to claim 1, wherein each of said plates includes means for venting heat from said body as said body is pulled through said passageway.

7. A guidance mechanism according to claim 6, wherein said means for venting comprises a plurality of elongated holes formed in each of said plates.

8. A guidance mechanism according to claim 1, wherein said means for holding said plates includes a support open at opposite ends so that said body can pass therethrough, and opposing side walls formed with slots for receiving said plates.

9. A guidance system according to claim 1, wherein said minimum size provides a tolerance dimension between each of the mutually confronting spaced surfaces and the respective opposing sides of said body defines said predetermined maximum dimension.

10. A guidance system according to claim 9, wherein said tolerance dimension equals said predetermined maximum dimension.

11. A method of growing a mono-crystalline body of a selected material, said method comprising the steps of
supplying a pool of melt of said material, and
pulling said body along a pulling axis from said melt through a passageway defined by opposing walls and positioned in a region where said body cools through a range of temperatures at which significant plastic deformation of said material can occur, said passageway having between said opposing walls a minimum spacing (1) greater than the maximum expected thickness of said body passing therebetween and (2) sufficiently small so that the body interacts with the passageway so as to reduce those flatness variations in the body as said body is pulled from the melt pool which exceed a predetermined maximum dimension as determined by the minimum spacing of said passageway so as not to exceed said predetermined dimension.

12. A method according to claim 11 wherein said body is ribbon-shaped, and said passageway is a rectangular slot found by two stationary members, said rectangular slot being narrower at its center than at its ends and the center portion of said body is pulled through the center of said slot.

13. A method according to claim 12, wherein said passageway is sized so that there is a gap between each side surface of said body and the corresponding side boundary of said passageway of from 2.4 to 4 mils.

14. A method according to claim 11, wherein the minimum spacing provides a tolerance dimension between each of the opposing walls and the respective opposing sides of the body define said predetermined maximum dimension.

* * * * *